United States Patent [19]

Song

[11] Patent Number: 5,744,821
[45] Date of Patent: Apr. 28, 1998

[54] THIN FILM TRANSISTOR-LIQUID CRYSTAL DISPLAY HAVING A PLURALITY OF BLACK MATRICES PER SINGLE PIXEL

[75] Inventor: Jun-Ho Song, Kyungki-do, Rep. of Korea

[73] Assignee: Samsung Electronics Co., Ltd., Kyungki-Do, Rep. of Korea

[21] Appl. No.: 614,932

[22] Filed: Mar. 11, 1996

[30] Foreign Application Priority Data

Mar. 10, 1995 [KR] Rep. of Korea ............ 95-4974
Jun. 12, 1995 [KR] Rep. of Korea ............ 95-15438

[51] Int. Cl.⁶ .................... H01L 29/04; H01L 31/036
[52] U.S. Cl. .................... 257/59; 257/72; 349/29; 349/110; 349/111
[58] Field of Search ............ 349/110, 111, 349/29; 257/72, 59

[56] References Cited

FOREIGN PATENT DOCUMENTS 403050527A  3/1991  Japan ............ 257/59

*Primary Examiner*—Tom Thomas
*Assistant Examiner*—Fetsum Abraham
*Attorney, Agent, or Firm*—Cushman Darby & Cushman IP Group of Pillsbury Madison & Sutro LLP

[57] ABSTRACT

The present invention relates to a thin film transistor-liquid crystal display and a manufacturing method of the same, which allows for repair of opened data lines and prevents shorts between adjacent gate electrodes. An opaque conductive material is deposited on a transparent substrate and patterned to form black matrices. The black matrix formed in each pixel unit is separated from other black matrix units, although, adjacent black matrices may connect through bridges in a column direction. Since the black matrix overlaps portion of the data line, and a portion of the gate line, this overlapped structure prevents backlight and also allows for a laser repair of opened data lines.

8 Claims, 3 Drawing Sheets

THIN FILM TRANSISTOR-LIQUID CRYSTAL DISPLAY HAVING A PLURALITY OF BLACK MATRICES PER SINGLE PIXEL

BACKGROUND OF THE INVENTION

1. Field of the Invention

The present invention relates to a thin film transistor-liquid crystal display (hereinafter referred to as a TFT-LCD) and a manufacturing method of the same.

2 Description of the Related Art

A conventional TFT-LCD has many gate lines and data lines.

Data lines are easily opened in a conventional TFT-LCD. A laser beam method is used to repair opened data lines in conventional TFT-LCDs. One repair method using a laser beam requires a rescue line in the TFT-LCD. An example of a rescue line is described in detail in U.S. Pat. No. 4,738,937. However, since rescue lines reduce screen display area, a TFT-LCD having rescue lines is not desirable. Therefore, a TFT-LCD having a black matrix which is able to repair the opened data line would be preferable to the TFT-LCD having a rescue line. However, data line repair has not been possible with a conventional TFT-LCD having a black matrix, such as shown in FIG. 1.

In FIG. 1, the cross sectional view shows a conventional TFT-LCD having a black matrix, which includes a substrate 2, a black matrix pattern 4 formed on the substrate 2, and an insulating layer 6 formed on both the substrate 2 and the black matrix 4. A gate electrode pattern 3 is formed on the insulating layer 6, and a gate insulating layer 8 is formed on both the gate electrode pattern 3 and on the insulating layer 6. An amorphous silicon pattern 9 is formed on the gate insulating layer 8. A source/drain pattern 10 is formed on both the amorphous silicon pattern 9 and on the gate insulating layer 8. A pixel electrode 11 is formed to be connected to the drain of source/drain pattern 10.

Since the black matrix pattern 4, which shields light from a backlight, and gate pattern 3 in each pixel unit are shorted to the adjacent gate patterns, it is impossible for the black matrix pattern to act as a substitute of a broken data line.

SUMMARY OF THE INVENTION

The object of the present invention is to provide a TFT-LCD and a manufacturing method of the same, which efficiently allows repairing opened data lines.

It is another object of the present invention to provide a TFT-LCD which not only allows repair of an open data line, but also prevents shorts between adjacent gate electrodes.

In order to achieve the above objects, among others, a TFT-LCD having a plurality of pixel units according to the present invention has black matrices isolated from each other, with a black matrix formed in each pixel unit. The black matrix overlaps the gate line and data line so that the resultant overlapped structure prevents backlight. Moreover, since the black matrix of each pixel is electrically isolated from adjacent black matrices, a defective data line can be repaired with a laser by using a portion of the black matrix to connect the disconnected data line portion.

It is desirable that the TFT-LCD black matrix also has a bridge which connects the adjacent black matrices in the column direction, which still allows for data line repair.

A method for manufacturing a TFT-LCD according to the present invention provides an electrically isolated black matrix structure that allows for laser repair of defective data lines.

BRIEF DESCRIPTION OF THE DRAWINGS

The preferred embodiment of the present invention will now be described more specifically with reference to the attached drawings, wherein.

DESCRIPTION OF THE PREFERRED EMBODIMENT

Figure 1:
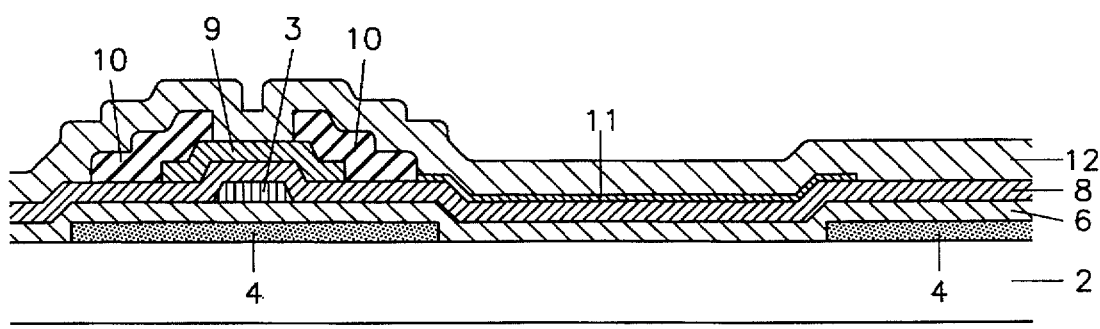
FIG. 1 shows a cross sectional view of a conventional TFT-LCD having a black matrix.
Figure 3:
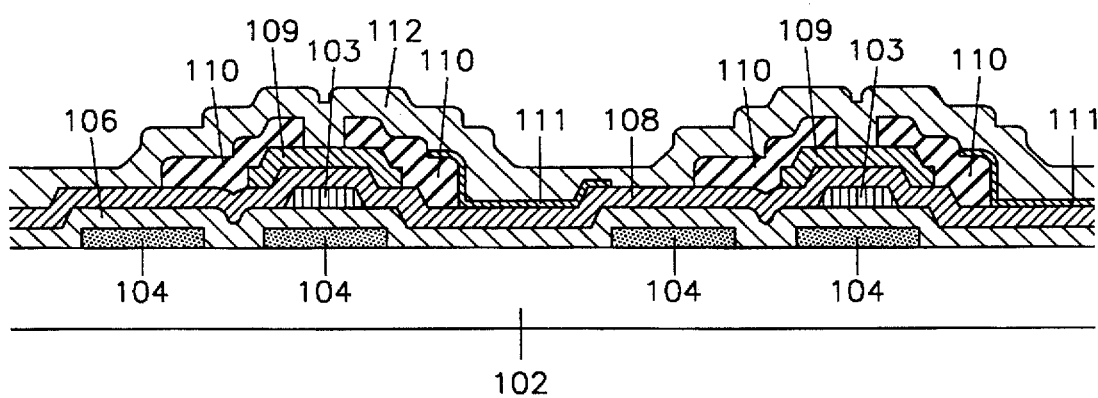
FIG. 3 shows a cross sectional view of a preferred embodiment of the present invention.

FIG. 3 shows a TFT-LCD having a plurality of pixel units according to a preferred embodiment of the present invention.

Black matrices 104 are isolated from each other, with a black matrix 104 formed in each pixel unit on a substrate 102. An insulating layer 106 is deposited on the black matrices 104. Gate electrodes 103 are formed on the insulating layer, with each gate electrode 103 overlapping a portion of the black matrix 104. A gate insulating layer 108 is deposited on both the gate electrodes 103 and insulating layer 106 and an amorphous silicon layer 109 is formed on each gate insulating layer 108 above a gate electrode 103. Source/drain electrodes 110 are formed on opposite ends of each amorphous silicon layer 109, with each source/drain electrode overlapping the black matrix 104. Pixel electrode 111 are formed and each is electrically connected to one drain electrode 110 within each pixel unit.

Figure 2:
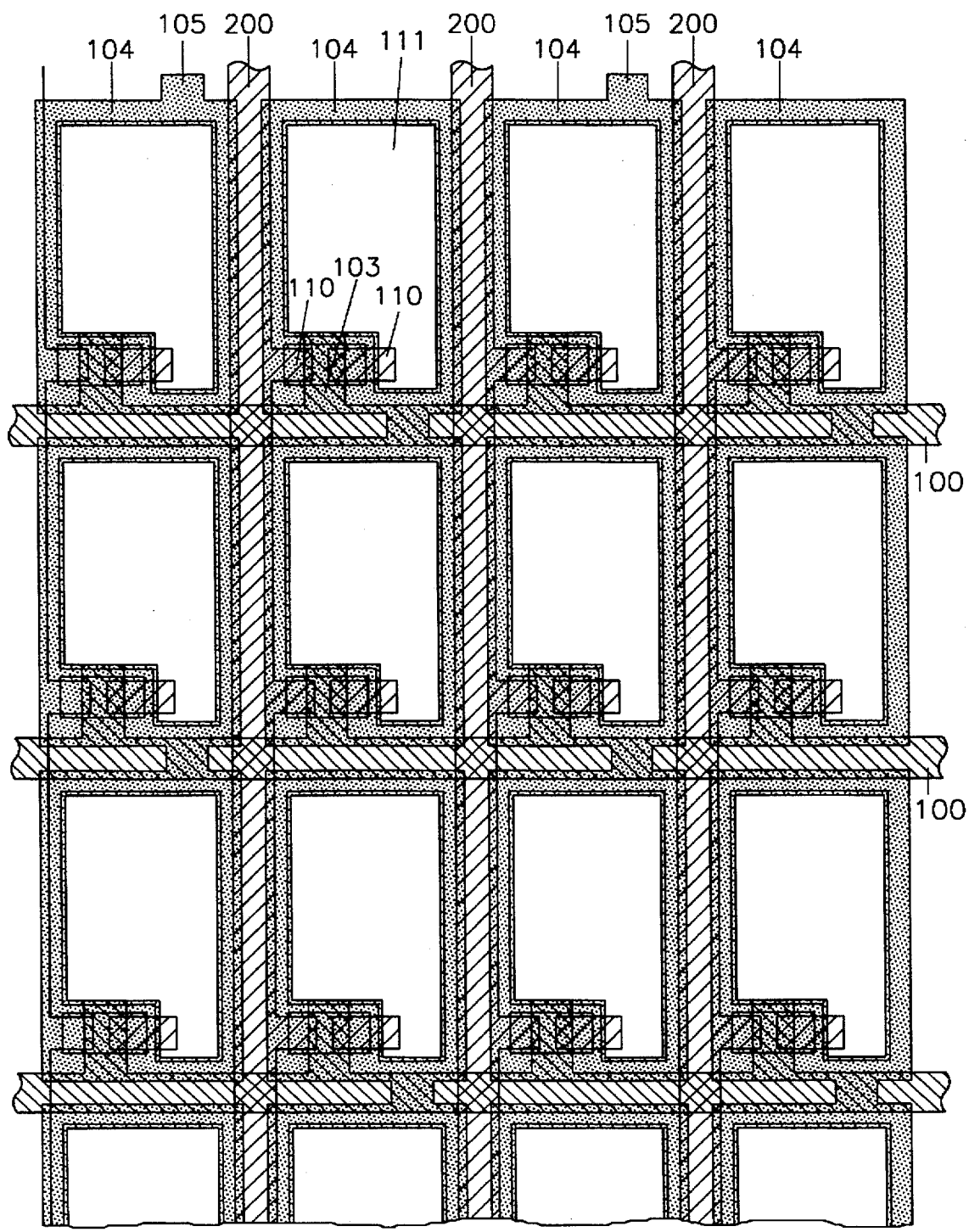
FIG. 2 shows a plan view of a preferred embodiment of the present invention.
Figure 4:
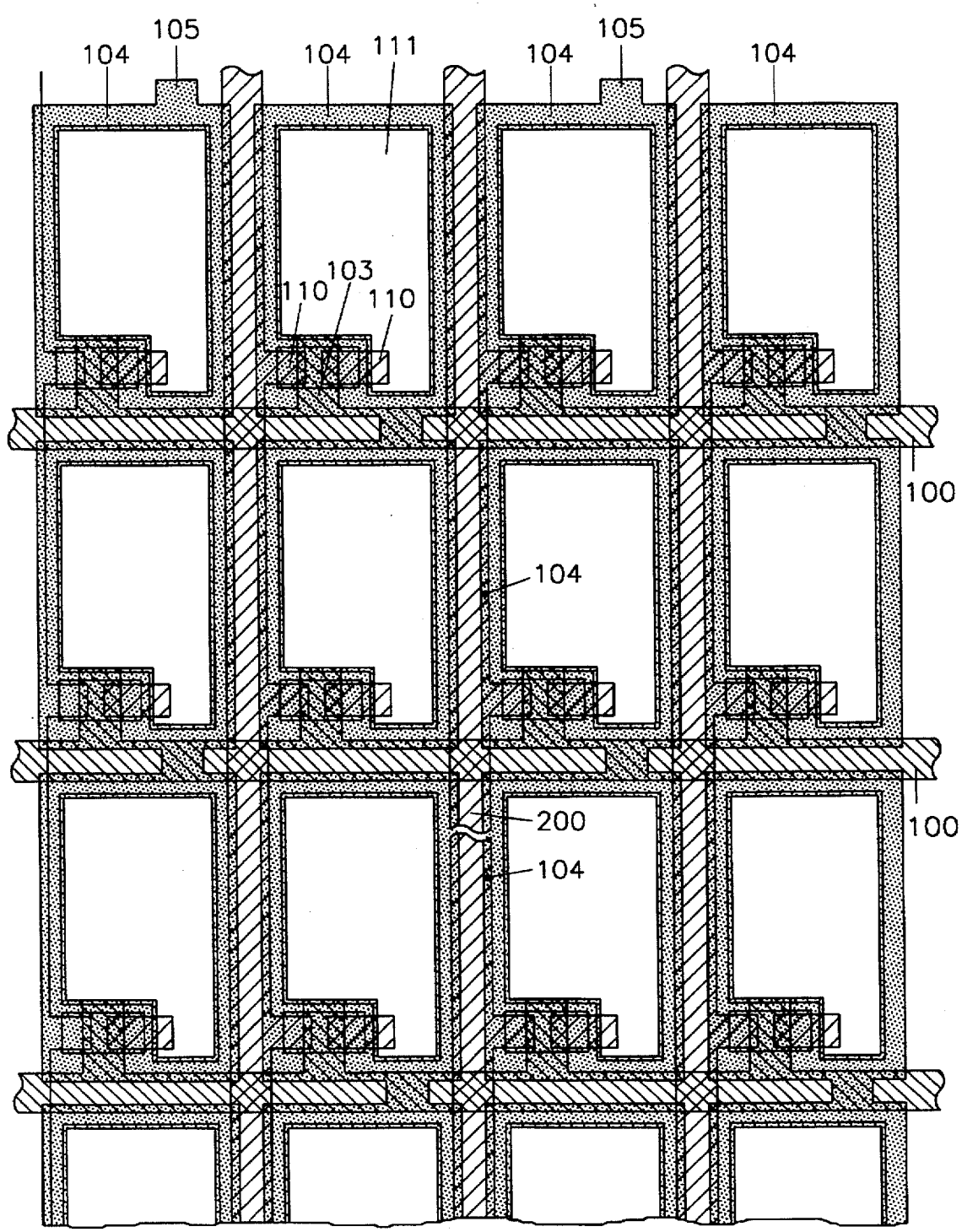
FIG. 4 shows repairing of a data line in a plan view of a preferred embodiment of the present invention.

FIG. 2 illustrates a top view of a TFT-LCD according to the present invention. FIG. 4 also illustrates in a plan view that it is desirable that the TFT-LCD has a bridge 112 which connects adjacent black matrices in the column direction. With this structure, the black matrices 104 are electrically isolated from each other so that, as shown in FIG. 4, easy repair of defective data lines is possible. When one of the data line 200 is broken and results in, for example, defective data line 201, portions such as 104A and 104B of the black matrix 104 are electrically connected to the defective data line 201 by a laser beam so that the black matrix portion 104C provides a conductive path which spans the broken portion of the defective data line 201. Thereby, a defective data line 201 can be repaired easily.

Leakage currents are not produced in the amorphous silicon layer 109, since the black matrix 104 is formed below the amorphous silicon layer 109. Thereby, the black matrix 104 cuts off the light from a backlight.

A manufacturing method for producing a TFT-LCD according to a preferred embodiment of the present invention will be described with reference to FIGS. 2 and 3.

An opaque conductive material is deposited on a transparent substrate 102 and patterned to form black matrices 104 and exposed portions of the substrate 102. A black matrix 104 is then formed in each pixel unit and the black matrices 104 are separated from each other. Thereafter, adjacent black matrices are connected in a column direction through bridges 112.

It is desirable to form a gate pad (not shown) which is connected to a gate drive 1C, at the same time as each black matrix 104.

An insulating layer 106 is then deposited over the entire surface, including the exposed portions of the substrate 102 and each black matrix 104. A conductive layer made of such as Cr, Ta or Al is deposited on the insulating layer 106 and etched to form gate electrodes 103 and gate lines 100. Each gate electrode 103 overlaps a portion of the associated black matrix 104.

A gate insulating layer 108 is then deposited over the entire surface, including gate electrodes 103 and insulating layer 106. An amorphous silicon layer is deposited on the gate insulating layer 108 and etched so that an active portion 109 of the TFT is formed above each gate electrode 103.

A second conductive layer made of such as Cr, Ta or Al is deposited and patterned to form source/drain electrodes 110 and data lines 200 in each pixel unit. A source electrode 110 and drain electrode 110 overlap one black matrix 104 in each pixel unit. Further, each black matrix 104 overlaps a data line 200 by about 2 to 3 µm. A transparent conductive layer is deposited and etched to form a pixel electrode 111 that connects with a portion of the drain electrode 110. Finally, a passivation layer 112 is deposited.

Since the black matrix 104 overlaps a portion of the data line and a portion of the gate line, the resultant overlapped structure cuts off light.

As described above, this invention not only repairs a opened data line but also prevents shorts between adjacent gate electrodes.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A thin film transistor-liquid crystal display comprising:
   a plurality of black matrices electrically isolated from each other and arranged in rows and columns on a substrate, each of said plurality of black matrices forming a portion of a pixel unit;
   an insulating layer disposed over said plurality of black matrices;
   a plurality of gate electrodes formed on said insulating layer, each gate electrode overlapping one of said black matrices;
   a gate insulating layer disposed over said gate electrodes;
   a plurality of amorphous silicon layers formed on said gate insulating layer, each amorphous silicon layer disposed above one of said gate electrodes;
   a plurality of source electrodes formed so that each source electrode is connected to one of said amorphous silicon layers at one end of said amorphous silicon layer and overlaps one of said black matrices;
   a plurality of drain electrodes formed so that each drain electrode is connected to one of said amorphous silicon layers at an end opposite said one end and overlaps one of said black matrices; and
   a plurality of pixel electrodes, each pixel electrode formed within one of said pixel units and electrically connected to one of said drain electrodes.

2. The thin film transistor-liquid crystal display according to claim 1 further including a bridge which electrically connects two different black matrices in said column direction.

3. The thin film transistor-liquid crystal display according to claim 1, wherein each black matrix overlaps a portion of a data line.

4. The thin film transistor-liquid crystal display according to claim 3, wherein each black matrix overlaps a portion of a gate line.

5. A thin film transistor-liquid crystal display comprising:
   a plurality of black matrices arranged in rows and columns on a substrate and electrically isolated from each other in a row direction so that black matrices adjacent to each other in a row direction are electrically isolated from each other, each of said plurality of black matrices forming a portion of a pixel unit;
   an insulating layer disposed over said plurality of black matrices;
   a plurality of gate electrodes formed on said insulating layer, each gate electrode overlapping one of said black matrices;
   a gate insulating layer disposed over said gate electrodes;
   a plurality of amorphous silicon layers formed on said gate insulating layer, each amorphous silicon layer disposed above one of said gate electrodes;
   a plurality of source electrodes formed so that each source electrode is connected to one of said amorphous silicon layers at one end of said amorphous silicon layer and overlaps one of said black matrices;
   a plurality of drain electrodes formed so that each drain electrode is connected to one of said amorphous silicon layers at an end opposite said one end and overlaps one of said black matrices;
   a plurality of data lines formed in a column direction which are each electrically connected to come of said plurality of source electrodes, said plurality of data lines partially overlapping said black matrices in column direction so that portions of black matrices can be used to repair a defective data line;
   a plurality of pixel electrodes, each pixel electrode formed within one of said pixel units and electrically connected to one of said drain electrodes.

6. The thin film transistor-liquid crystal display according to claim 5 further including a bridge which electrically connects two different black matrices in said column direction.

7. The thin film transistor-liquid crystal display according to claim 5, wherein each black matrix overlaps a portion of one of said data lines.

8. The thin film transistor-liquid crystal display according to claim 7, wherein each black matrix overlaps a portion of one of a plurality of gate lines, said gate lines being formed in said row direction.

\* \* \* \* \*